US006229947B1

(12) United States Patent
Vawter et al.

(10) Patent No.: US 6,229,947 B1
(45) Date of Patent: *May 8, 2001

(54) TAPERED RIB FIBER COUPLER FOR SEMICONDUCTOR OPTICAL DEVICES

(75) Inventors: Gregory A. Vawter; Robert Edward Smith, both of Albuquerque, NM (US)

(73) Assignee: Sandia Corporation, Albuquerque, NM (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/944,657

(22) Filed: Oct. 6, 1997

(51) Int. Cl.[7] .............................. G02B 6/10; G02B 6/30
(52) U.S. Cl. .......................... 385/132; 385/43; 385/49; 385/131
(58) Field of Search .............................. 385/132, 28, 43, 385/49, 131; 372/50, 45

(56) References Cited

U.S. PATENT DOCUMENTS 5,737,474 * 4/1998 Aoki et al. .......................... 385/131
5,745,630 * 4/1998 Vawter et al. ....................... 385/129
5,844,929 * 12/1998 Lealman et al. ...................... 372/45

* cited by examiner

Primary Examiner—John D. Lee
(74) Attorney, Agent, or Firm—Gregory A. Cone

(57) ABSTRACT

A monolithic tapered rib waveguide for transformation of the spot size of light between a semiconductor optical device and an optical fiber or from the fiber into the optical device. The tapered rib waveguide is integrated into the guiding rib atop a cutoff mesa type semiconductor device such as an expanded mode optical modulator or and expanded mode laser. The tapered rib acts to force the guided light down into the mesa structure of the semiconductor optical device instead of being bound to the interface between the bottom of the guiding rib and the top of the cutoff mesa. The single mode light leaving or entering the output face of the mesa structure then can couple to the optical fiber at coupling losses of 1.0 dB or less.

19 Claims, 13 Drawing Sheets

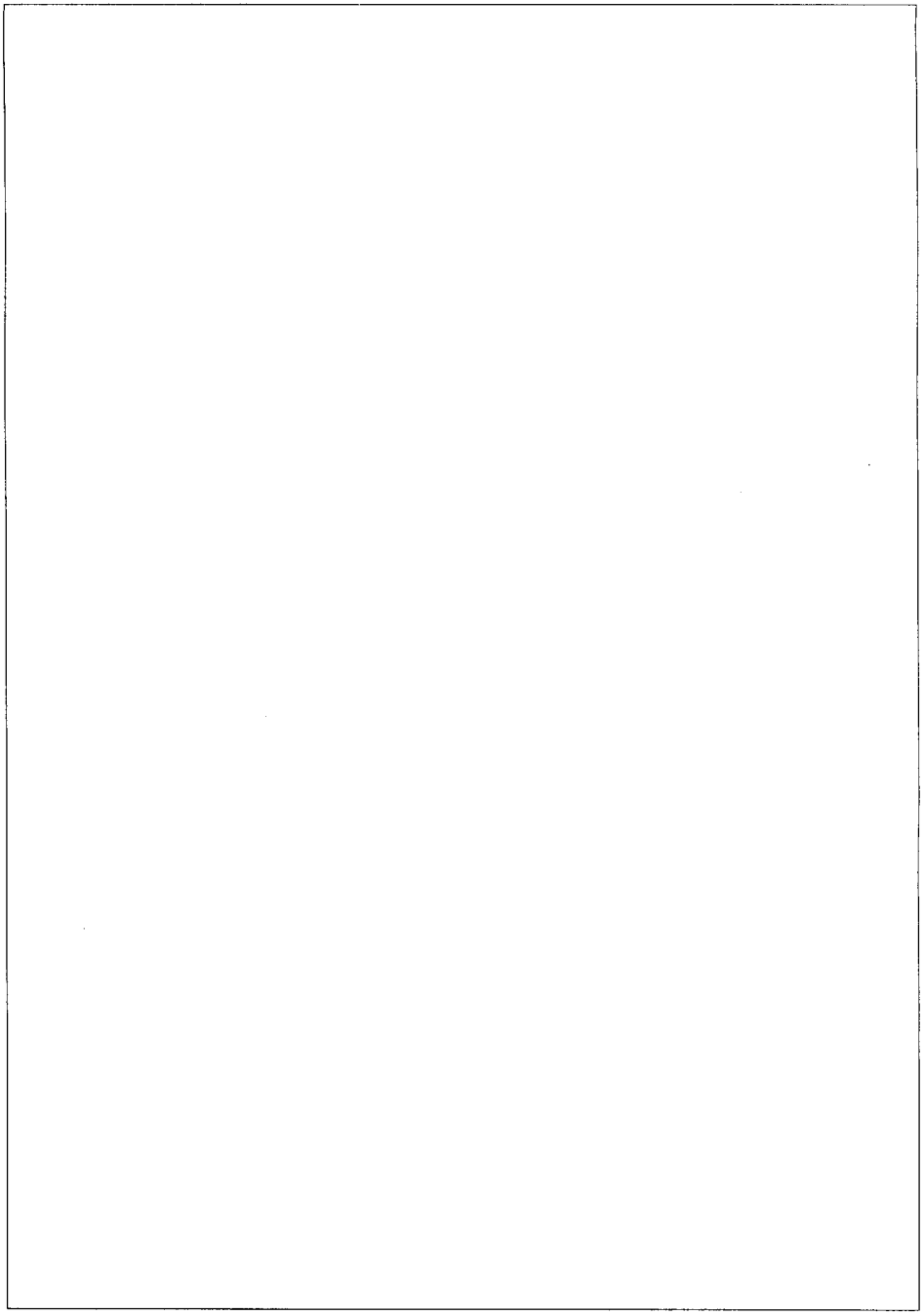

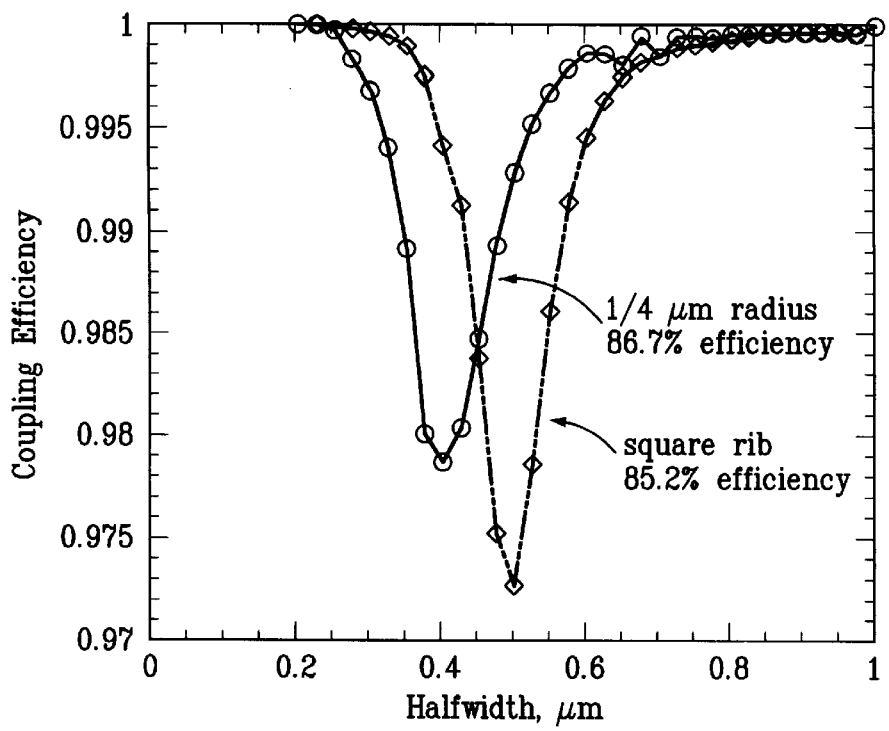
FIG. 8
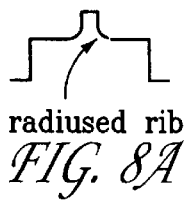
FIG. 8A
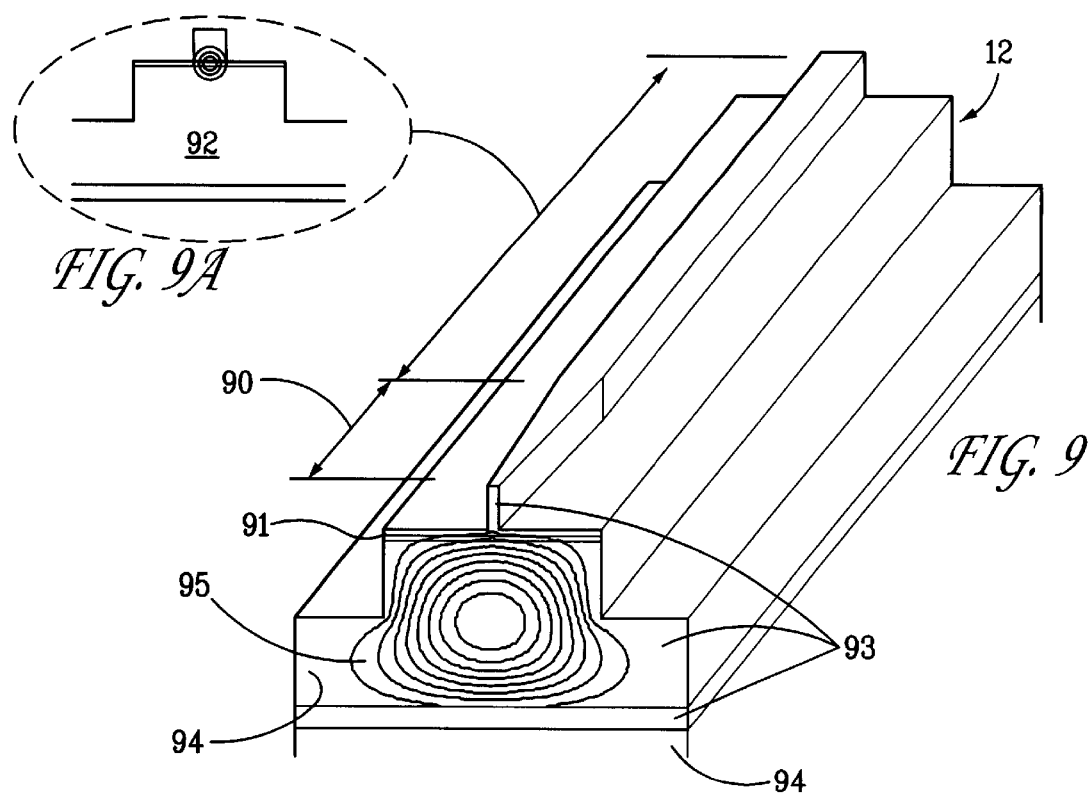
FIG. 9A
FIG. 9

TAPERED RIB FIBER COUPLER FOR SEMICONDUCTOR OPTICAL DEVICES

CROSS-REFERENCE TO RELATED APPLICATIONS

This invention is related to U.S. patent application Ser. No. 08/603,841 now U.S. Pat. No. 5,745,630 which discloses the cutoff-mesa isolated rib optical waveguide to which the present tapered rib coupler is connected. This patent application is incorporated by reference herein in its entirety.

STATEMENT REGARDING FEDERALLY SPONSORED RESEARCH OR DEVELOPMENT

This invention was made with Government support under Contract DE-AC04-94AL85000 awarded by the U.S. Department of Energy. The Government has certain rights in this invention.

BACKGROUND OF THE INVENTION

This invention relates to semiconductor optical devices. More specifically it relates to a novel tapered rib waveguide structure useful in coupling the output of the semiconductor optical device into and out of an optical fiber. Even more specifically, it relates to a device that achieves two dimensional expansion or contraction of the output optical mode of single-transverse-mode semiconductor waveguide modulators and lasers.

High performance optoelectronic systems using optical fiber signal routing require low-cost and low-loss coupling between single-mode fibers and active or passive semiconductor waveguide devices and circuits. However, the 1–3 $\mu$m elliptical modal spot of typical semiconductor waveguides is poorly matched to the 8–9 $\mu$m circular modal spot of conventional single-mode optical fibers. This modal mismatch results in a 7–10 dB insertion loss when directly coupling light between these single-mode fibers and semiconductor waveguides. Non-integrated solutions that improve this coupling efficiency often do so at the cost of tight alignment requirements and are thus not well suited for low-cost package using passive alignment systems. Tapered waveguide transitions offer a monolithically-integrated means by which efficient coupling can be achieved with relaxed alignment requirements. Most of these approaches, however, require complex growth or processing steps such as multiple etch-regrowth sequences or lithographic patterning of extremely small radius waveguide tips in order to achieve the desired coupler performance.

One reference of interest is U.S. Pat. No. 5,574,742 for a "Tapered Beam Expander Waveguide Integrated with a Diode Laser." Therein the structure analogous to the tapered rib in the present invention, therein called the first semiconductor waveguiding layer is etched in a multi-step process to form a very sharp (less than 500 Angstroms radius) edge. The light emanating from this edge then is coupled into the optical fiber. The process to form the edge is complicated, the sharpness of the edge is essential to prevent scattering of light, and the height of the structure is critical, given that an etch stop is necessary below the first semiconductor waveguiding layer. This structure does not force the light in this layer down into a lower layer, as is done in the present invention.

There remains in the art an unmet need for an improved waveguide coupler structure that can be made easily and yet couple the light between a semiconductor optical device, such as an optical modulator or a laser, and an optical fiber with very high efficiency.

BRIEF SUMMARY OF THE INVENTION

The various shortcomings and challenges in the prior art have been solved by the present invention which uses a monolithic tapered rib waveguide extending from the end of a small rib waveguide located on top of a thick lower cladding which is partially etched to form a mesa structure. When the small rib is sufficiently wide, the fundamental optical mode is confined to the small rib, and the device functions as an efficient modulator or laser with high confinement of light within the undoped GaAs layer. The tapered rib extends from the end of the small rib towards the output face of the mesa structure, tapering down in width from the small rib to a smaller width at the end of the tapered rib. The decrease in the width of the tapered rib causes the fundamental optical mode to drop down into the mesa structure and away from the tapered rib as its width decreases. The optical mode remains centered below the tapered rib and well-behaved within the mesa. When it exits the output face of the mesa structure, it has excellent divergence characteristics which match extremely well with single mode, long wavelength optical telecommunication fiber, resulting in coupling loss below 1.0 dB for a semiconductor laser. The device works equally well to couple light from a fiber into the optical device having the tapered rib waveguide. The tapered waveguide is particularly well suited for integration with both active and passive etched rib waveguide structures. Fabrication is relatively simple, requiring only patterning and etching of the tapered waveguide and uniform-width outer mesa waveguide without any epitaxial regrowth.

Described herein is a tapered rib waveguide and its application to both passive optical modulators at 1.3 $\mu$m wavelength and active diode lasers at 0.98 $\mu$m wavelength. All of these tapered rib structures achieve less than 1 dB coupling loss to single-mode fiber at the design wavelength and may be fabricated with a single epitaxial growth step followed by conventional lithography and etch steps. One of these devices has even been designed using 1 $\mu$m minimum feature sizes and fabricated using contact-print optical lithography. This is the first known use of standard contact-print photolithography in the successful fabrication of a laterally-tapered adiabatic mode expander.

BRIEF DESCRIPTION OF THE SEVERAL VIEWS OF THE DRAWING

FIG. 3 is a perspective view taken from an SEM image showing the 25 nm steps in the rib width, this device being made very short to obtain this image.

FIG. 8 is a graph showing individual step coupling efficiencies through the taper in FIG. 1B as a function of segment width for square and rounded rib sidewall-to-mesa interface transitions.

FIG. 9 is an isometric view of the tapered rib waveguide used with a laser showing the various elements of the combined device and the expanded size of the output optical mode at the cleaved end (output face) of the device and its downwardly shifted position relative to the confined aspect it has in the active section of the laser.

DETAILED DESCRIPTION OF THE INVENTION

The following description is divided into several parts. First, the theoretical basis for the device is explained using a doped pin-diode waveguide as an example. Spot-size transformation efficiency is calculated at different tapered rib waveguide etch depths and for etch ribs with rounded bases. Excess loss and fiber coupling performance data are then presented for these tapered rib waveguides fabricated using the example design. Then, using the pin-waveguide as a starting point, a 980 nm wavelength InGaAs/A/GaAs diode laser design is presented and performance data of fabricated laser with this tapered waveguide are shown.

Finally, a tapered rib waveguide design suitable for unintentionally doped Schottky diode waveguide modulators is presented and mode-expansion performance data are given.

Figure 1B:
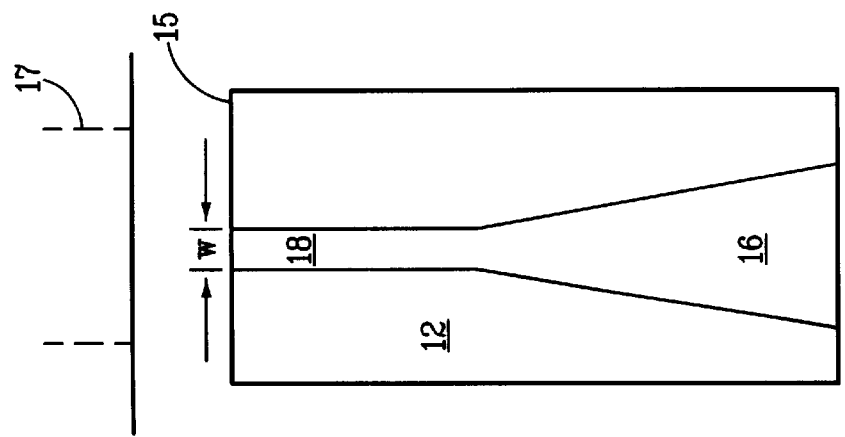
FIGS. 1A and 1B are cross-section and plan views respectively of the tapered rib waveguide implemented as in a pin (p doped-intrinsic-n doped) modulator.
Figure 1A:
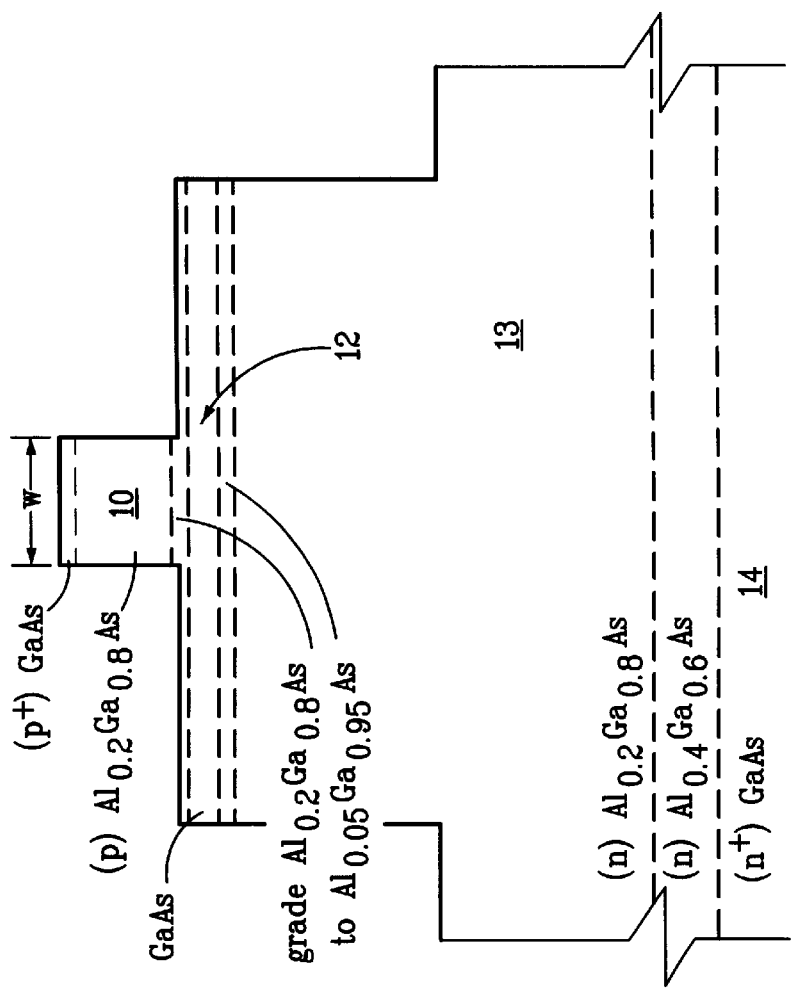
Figure 2A:
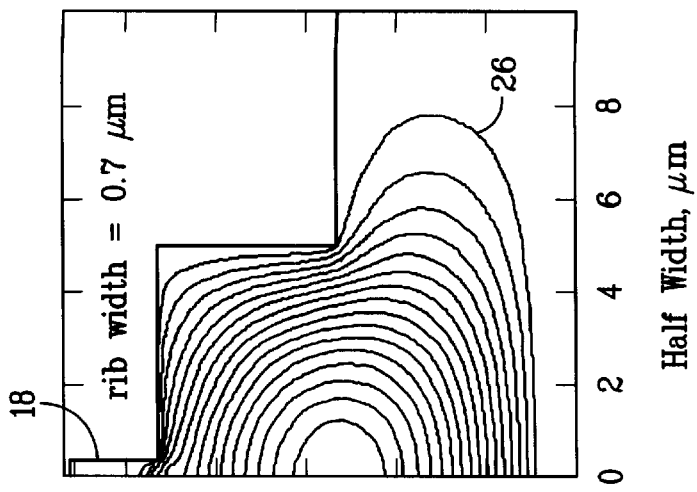
FIGS. 2A, 2B and 2C are contour plots of constant field of eigenmodes at three different widths of the tapered rib showing a wide rib with small spot size, an intermediate rib width with spot size in transition and a narrow width with large spot size that has moved down into the mesa, respectively.
Figure 2B:
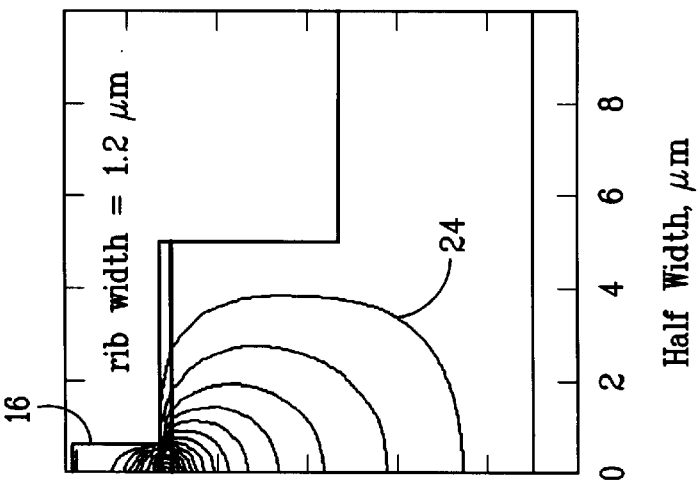
Figure 2C:
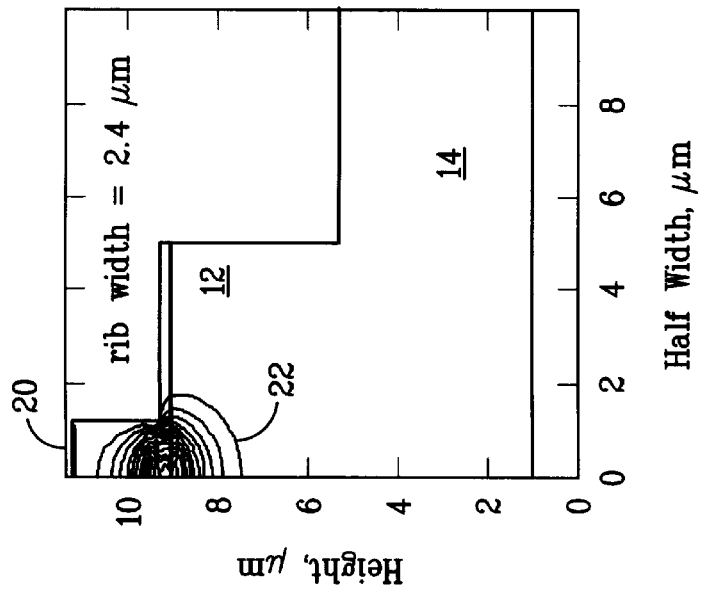

One particular design of a tapered rib device, intended for use with a pin junction optical phase modulator at 1.3 $\mu$m wavelength, is shown in FIGS. 1A and 1B. In these figures, a small rib waveguide 10 is located on top of a thick lower cladding 13 which is partially etched to form a mesa structure 12. When the small rib is sufficiently wide the fundamental optical mode is confined to the small rib 20 (FIG. 2a) and the device functions as an efficient modulator with high confinement of light within the undoped GaAs layer. The modulator, not shown, would be monolithically connected to the downward facing surface of the wide end of the tapered rib waveguide in FIG. 1b and have a constant width rib of the wide dimension. At the other extreme, when the small rib 18 is sufficiently narrow, the fundamental mode expands to fill the larger mesa waveguide (FIG. 2c). This behavior is a consequence of the design of the waveguide layers. The thickness and composition of the GaAs (the high refractive index region and graded AlGaAs layers at the top of the mesa 12 and extending under the small rib 10 are such as to prevent guiding of light within these layers if the upper layers comprising the small rib are etched away. The resulting waveguide allows separate optimization of the optical mode properties of the rib and mesa waveguides at the two extremes of rib width. At large rib widths high-performance modulator function can be achieved while at small rib widths the dimensions of the large mesa and thickness of the lower cladding materials establish the optical mode size of the mesa waveguide for optimum coupling to single-mode fiber. The expanded mode 26 (FIG. 2c) has been designed for optimum coupling directly to single-mode 1.3 $\mu$m telecommunication fiber. Modal overlap integral calculations predict greater than 90 percent power coupling between the expanded mode and an 8 $\mu$m mode diameter optical fiber 17.

Numerical modeling is required to ensure that the mode expansion occurs with a minimum of excess loss. Selection of the most appropriate modeling tool requires consideration of the actual fabrication method and its influence on the final waveguide topology. The tapered waveguide structure is fabricated using electron-beam direct write or optical contact print lithography followed by highly anisotropic reactive-ion-beam etching (RIBE). These techniques result in a waveguide taper comprising abruptly joined straight segments whose widths progressively decrease in precise (e.g. 0.025 $\mu$m) steps. An example of a stepped taper is shown in FIG. 3. The modal evolution of such a waveguide made up of longitudinally invariant segments is well described using a 2D finite-element model to find the fundamental mode at each segment along the taper provided that the taper slope is sufficiently gradual. The radiation loss of the taper can then be calculated using modal overlap integrals to estimate the coupling efficiency across each step and then multiplying all of the individual step-coupling efficiencies to determine the overall power-conversion efficiency. For low-loss waveguides, this radiation loss is the excess taper loss. Such an approach is computationally faster than 3D beam-propagation method and provides accurate eigenmode solutions at each rib width. All 2D modal calculations employ a variable mesh size between 20 and 200 nm with finer meshing used at refractive-index discontinuities.

Figure 4:
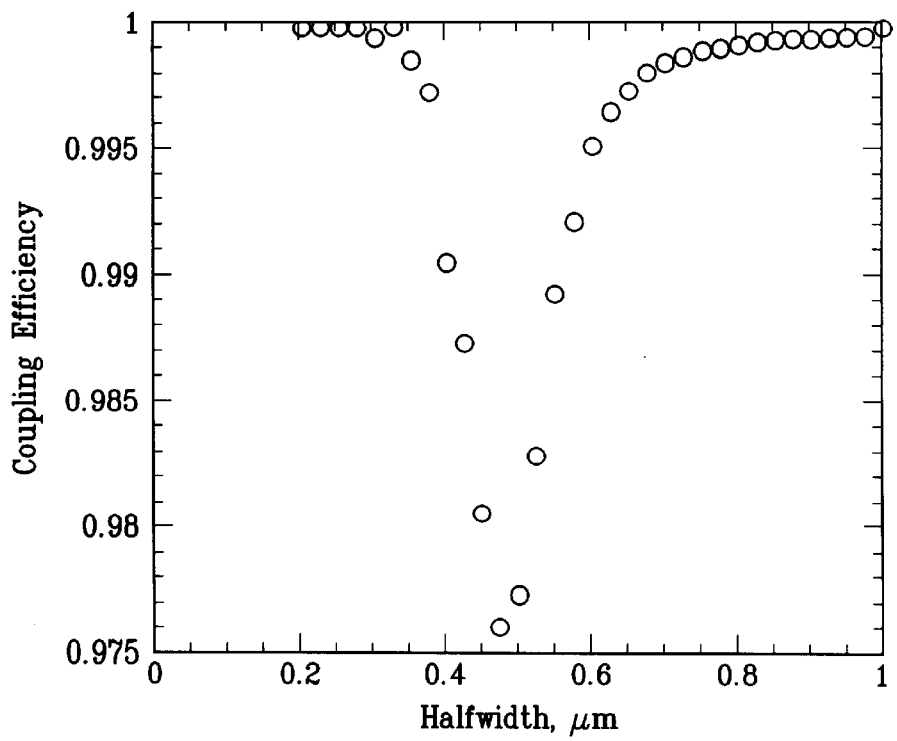
FIG. 4 is a graph showing the individual step coupling efficiency in the tapered region of FIG. 1B as a function of segment width.

FIG. 4 shows the individual step coupling efficiency through the taper in FIGS. 1A and 1B as a function of segment width. Steps are 0.025 $\mu$m and alternate between the left and right sides of the taper. For large rib halfwidths, the mode is confined to the small rib 16 as seen in FIG. (2a) where the halfwidth is 1.2 μm. As the rib sections narrow, the segment-to-segment coupling is high and varies only slightly with width until the halfwidth of the small rib 18 reaches roughly 0.7 μm. The flat coupling efficiency for large halfwidths results from the mode shape changing only slightly in this section of the taper. Below 0.7 μm halfwidth the mode begins to change shape more rapidly and gradually shift power down into the lower mesa below the rib. FIG. (2b) shows one of these transitional modes 24. The changing mode shape and peak intensity location results in a dip of the segment-to-segment coupling between 0.7 μm and 0.3 μm halfwidth. Below 0.3 μm halfwidth the mode 26 is largely confined in the mesa waveguide (FIG. 2c) such that further reduction of the small rib width has little influence on the optical mode. Completion of the mode expansion into the large mesa waveguide occurs at significantly large rib widths which can readily be resolved using conventional optical contact lithography. In the present example mode expansion is complete when the rib halfwidth is 0.3 μm. In fact, the rib may be abruptly terminated at any fullwidth below 0.7 μm without significant penalty. Hence, although FIGS. 1A, 1B and 3 show the end of the tapered section extending to the edge of the mesa, the tapered waveguide could be completely absent from the top of the mesa past a certain point as described above as shown in FIG. 17B. Shown here are the rib as it tapers from its wide section 75 through its tapered section 79 to its end 74. The rib sits on the mesa with its side walls 72 and output face 73 with the mesa siting on the substrate 70.

Overall taper radiation loss is the product of all the individual segment-to-segment coupling efficiencies. In the present example this is 85.7 percent (equivalent to 0.67 dB radiation loss). A three-dimensional beam propagation calculation was used to benchmark the successive modal overlap model and to aid in selecting a taper length for good mode conversion. Results of this calculation are in good agreement with the successive modal overlap model and suggest that tapers with >500 μm length have the desired <1 dB theoretical radiation loss.

Figure 5:
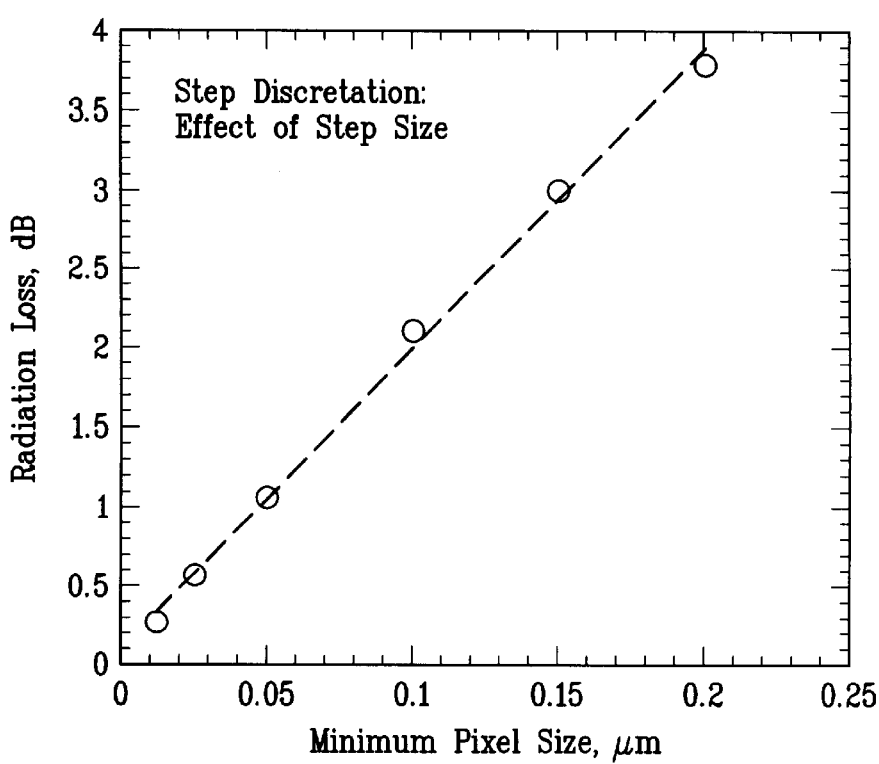
FIG. 5 is a graph showing radiation scattering loss versus minimum pixel (or step) size used to pattern the tapered rib waveguide.

The two key physical parameters influencing the power conversion efficiency are the step size used in patterning the taper and the etch depth of the rib. Additional modeling has shown that the excess loss of the taper expressed in dB is essentially linearly proportional to the step size used in creating the taper (FIG. 5). It is this dependence of radiation loss on sidewall step size that has prompted the use of electron-beam direct write in the initial demonstration of the tapered rib waveguide. Although the minimum dimensions of the taper are within the capabilities of conventional contact lithography, the step size of 0.025 μm required for less than 1 dB excess loss is not available from commercial mask vendors without the use of a reducing reticle. Fabrication of a different tapered rib design using conventional contact printing with a specially-made photolithographic plate is described below.

Figure 6:
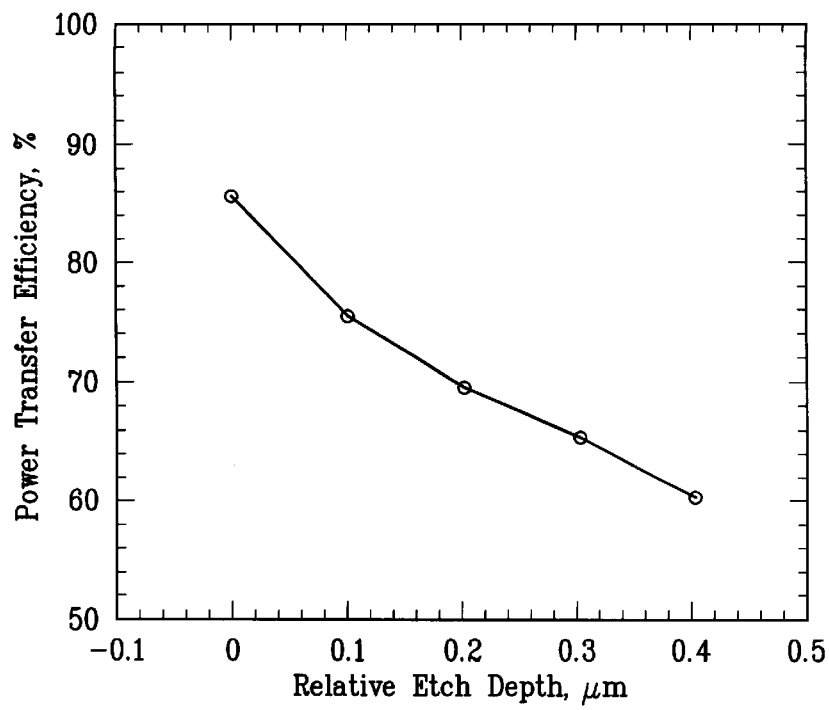
FIG. 6 is a graph showing power transfer efficiency of spot-size transformation as a function of rib waveguide etch depth, relative to the etch depth of FIG. 1A.
Figure 7:
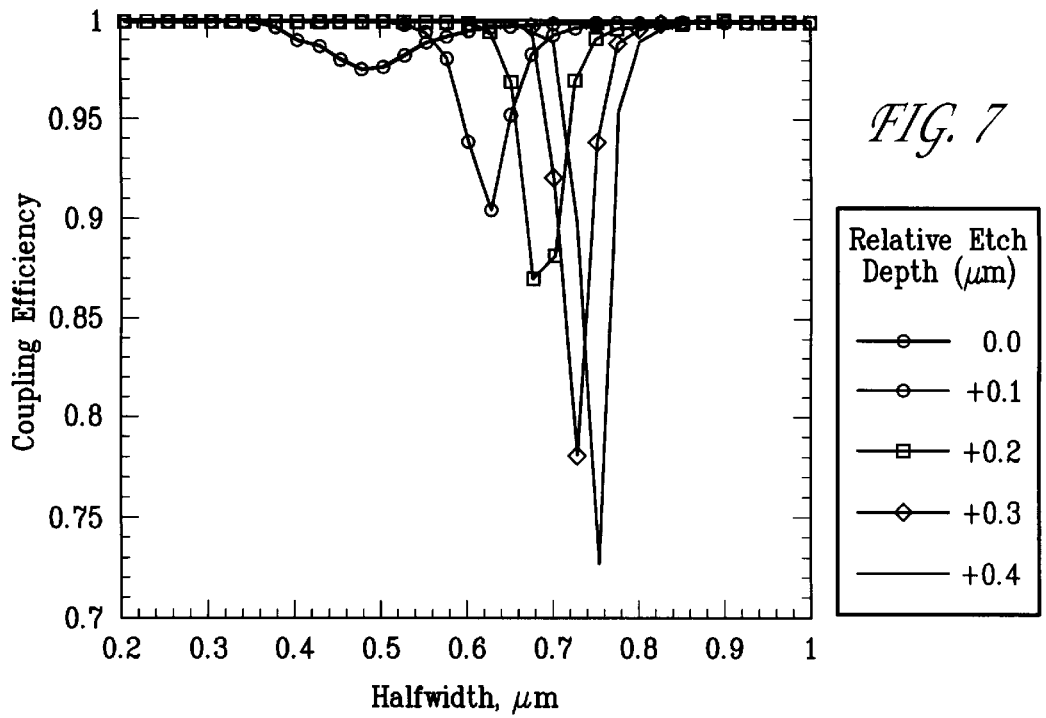
FIG. 7 is a series of plots of individual step efficiencies through the taper in FIG. 1B as a function of segment width for a variety of different rib waveguide etch depths, again relative to FIG. 1A.
Figure 10:
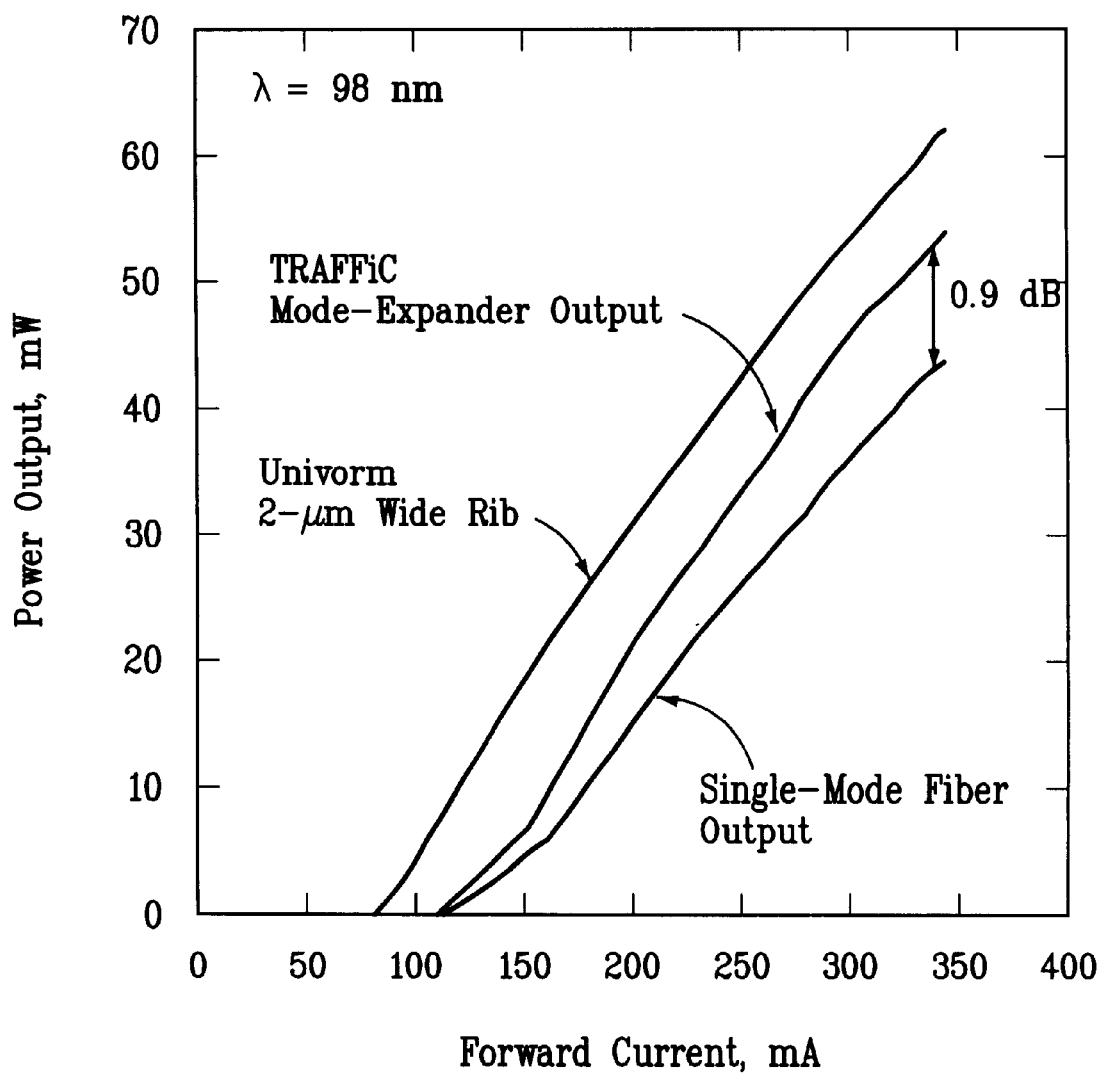
FIG. 10 is a graph showing the threshold characteristics of the laser with and without the tapered rib waveguide as well as power output in a single mode fiber. Data are for 2 microsecond current injection pulses at 1 kHz repetition rate.
Figure 11A:
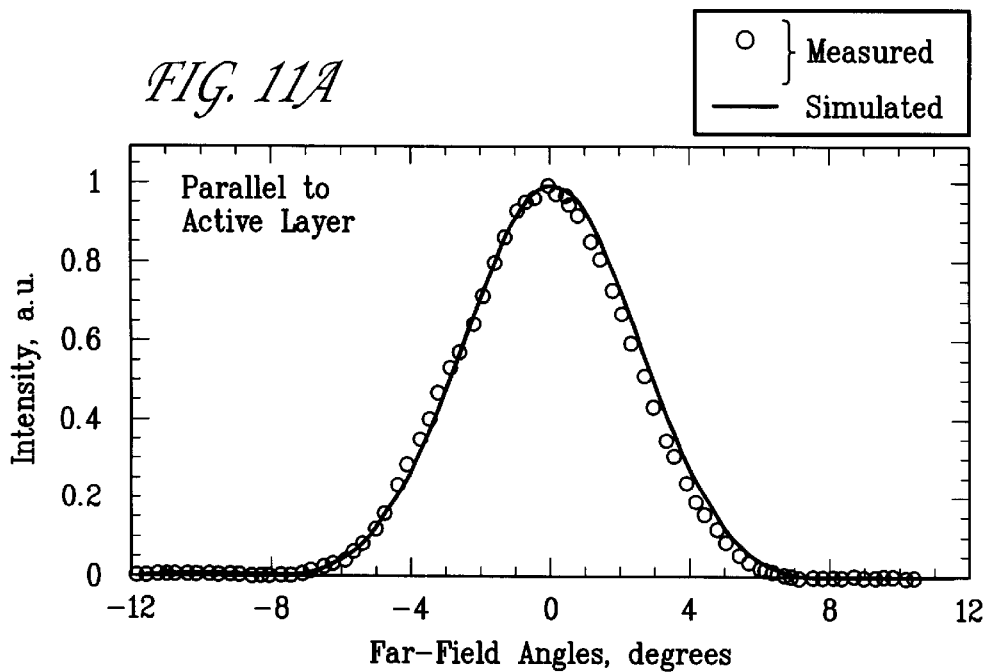
FIG. 11 is a graph showing the far-field emission patterns of the tapered rib waveguide laser output along axes parallel and perpendicular to the epitaxial layers. The symbols are data from two different devices; the solid line is a simulation.
Figure 11B:
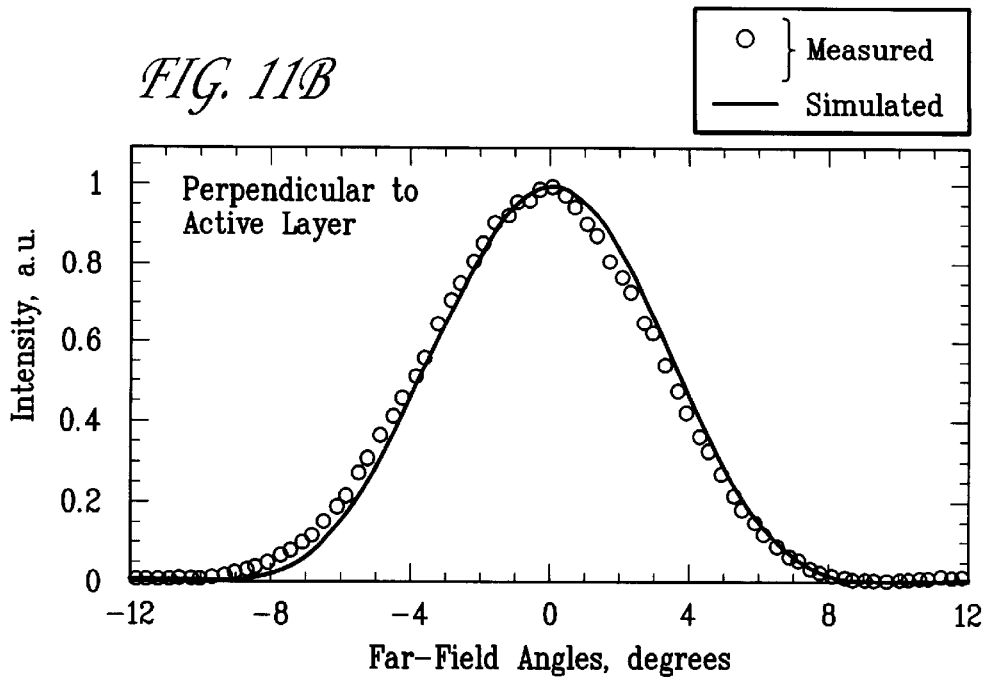
Figure 12A:
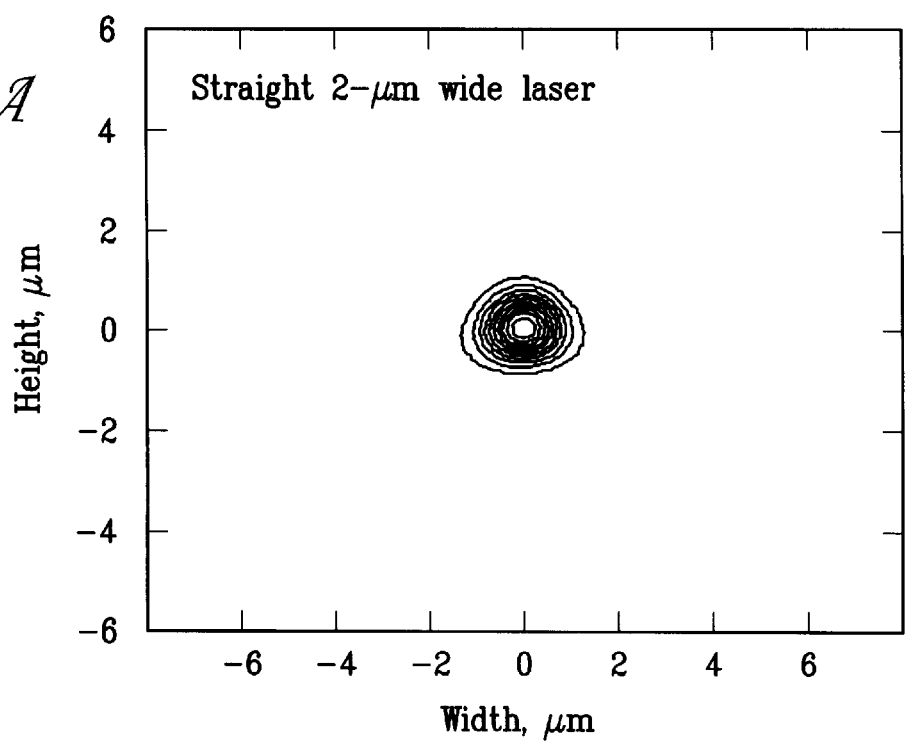
FIGS. 12A and 12B are graphs showing linearly-spaced contour plots of measured near-field emission intensity patterns of a 2 micron-wide control laser and an expanded mode tapered rib waveguide laser.
Figure 12B:
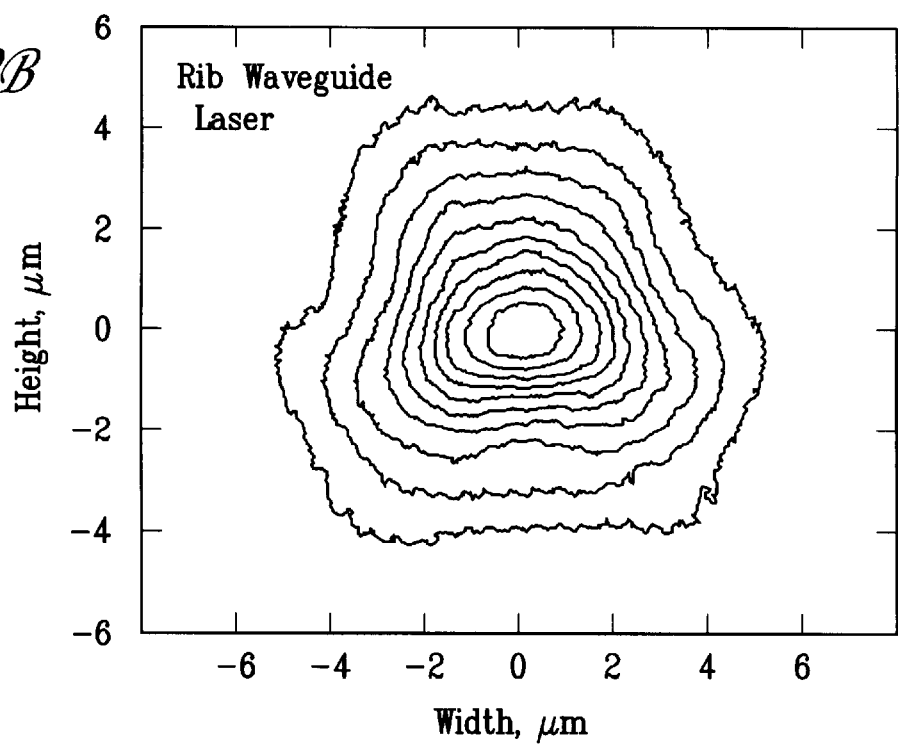

Variation of excess loss with etch depth of the small rib is shown in FIG. 6. Power conversion efficiency drops linearly with etch depth from the best value of approximately 86% down to only 60% for etching 0.4 μm deeper than shown on FIG. 1a. Careful examination of the individual step coupling efficiencies of tapers with different etch depths (FIG. 7) provides some insight into the function of the tapered rib waveguide. As is clearly evident in FIG. 7, as the etch depth is increased, the transition point where the greatest variation in the mode shape occurs moves to larger rib sizes. Movement of the transition point to larger rib sizes for deeper etches is a result of the reduced modal effective index of the more deeply etched ribs approaching the effective modal index of the eventual mesa mode more quickly as the rib narrows along the length of the taper. In addition the mode evolution tends to "snap" more quickly from confinement in the rib to confinement in the mesa. In other words, the bulk of the mode transition occurs in just a few segments of the tapered rib waveguide and these few transitions have reduced coupling efficiency. Etching 0.1 μm less deeply than shown in FIG. 1a (a relative etch depth of −0.1 μm in FIGS. 6 and 7) results in confinement of the expanded optical mode by the layers at the top of the mesa and no vertical mode expansion. Calculated power coupling efficiency of the expanded-mode waveguide output into an 8-μm spot size ($1/e^2$ intensity diameter) single-mode optical fiber remains between 91.7 and 93.7 percent for all the waveguides plotted in FIG. 6.

Figure 17A:
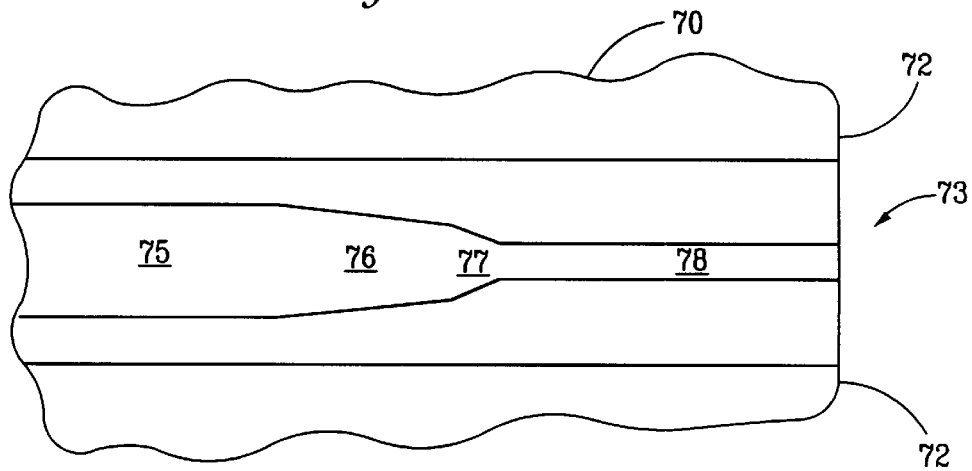
FIGS. 17A and 17B are plan views of two embodiments of the tapered rib coupler, one showing a nonlinear taper and the other showing the tapered rib terminating short of the output face of the mesa.
Figure 17B:
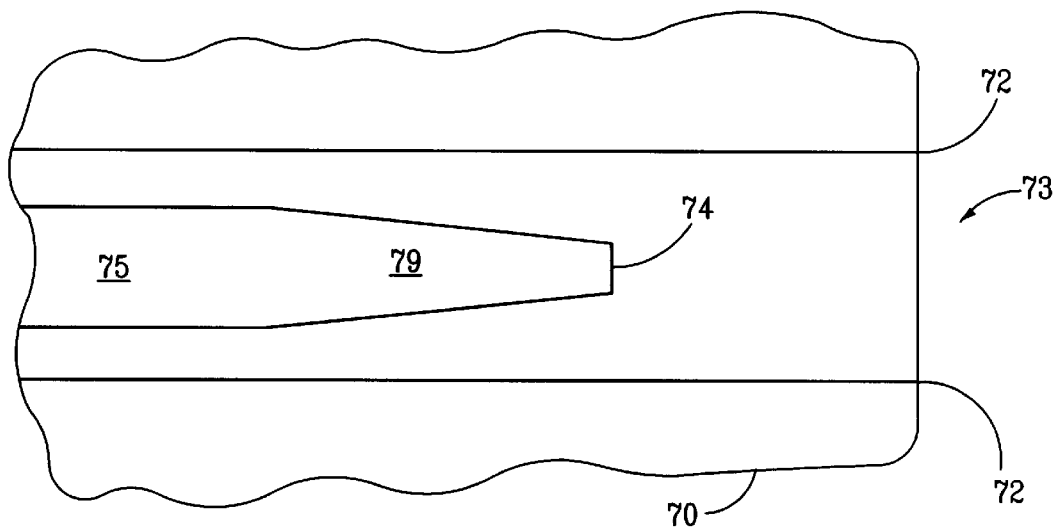

Clearly, control of the etch depth to within 0.05 μm is required for fabrication of high-quality tapered rib spot-size transformers. In-situ reflectometry monitoring of etch depth is used to achieve the needed etch-depth control and reproducible mode-expansion efficiency. As a further aid in fabrication of tapered rib waveguides, the use of linear tapers with width variation in excess of the minimum required for spot-size transformation provides substantial tolerance to rib width, etch depth variations, and inaccuracies in epitaxial layer composition and thickness. Non-linear tapers, with a rapid width variation in regions where the mode shape is relatively insensitive to rib width and much slower variation in the critical width region where the bulk of the mode transformation occurs as shown in FIG. 17A. The rib sits on the mesa with its side walls 72 and its output face 73 with the mesa sitting on the substrate 70. The rib has a non-linear taper between its wide section 75 and its narrow section 78, with the steep taper in portion 76 and the more gradual taper in portion 77, offer much shorter overall coupler lengths (and lower absorption losses) but also have significantly reduced processing tolerances for fabrication of low-loss couplers.

A common result of semiconductor rib waveguide etching is a rounded transition between the vertical rib sidewall and the horizontal mesa surface. Ribs with such a fillet behave within a tapered rib device as though the rib were square but slightly larger than the desired width. FIG. 8 shows plots of the individual step coupling efficiency through the taper both with and without an actual 0.25 μm radius fillet at the bottom of the etched rib for the same etch depth used in FIG. (4). Addition of the radius to the rib reduces the halfwidth of the rib where spot-size transformation occurs by ~0.1 μm and slightly improves the power conversion efficiency. The 1.5% improvement in efficiency is a direct result of the more gradual transition between the rib sidewall and mesa top.

The tapered rib structure discussed above is intended for use with high figure-of-merit pin phase modulators or Mach-Zehnder interferometers at 1.3 μm wavelength. Demonstration of coupler operation was done using discrete straight rib waveguides (FIG. 2a) and mesa waveguides (FIG. 2c) along with tapered rib waveguide structures on mesa waveguides (FIGS. 2a–2c and FIG. 1b). These were fabricated using (Al)GaAs waveguides identical to FIG. (1a). The linearly-tapered waveguides used a w=0.7 μm final narrow width. Epitaxial layers were grown by molecular-beam epitaxy. The upper and lower cladding layers were doped p- and n-type, respectively, so that the 2.4 μm-wide rib waveguides are compatible with reverse-biased pin-junction phase modulators. Waveguide rib structures were patterned using electron-beam direct-write lithography with negative-acting electron-beam resist and a 25 nm exposed pixel spacing. Spacing between the 25 nm rib-width steps was approximately 15 μm for a 1 mm taper length. The mesa waveguide was patterned using conventional optical contact-print lithography. Etching of both the rib waveguide and mesa used chlorine reactive-ion-beam etching. Although these devices were patterned with direct-write techniques, the 0.7 μm minimum width of the waveguide taper could be defined using optical methods.

To evaluate mode spot-size transformation, a mesa waveguide and a tapered-rib mode converter were alternately excited using a single-mode fiber (3M, FS-HB-6621, design wavelength=1.3 μm and modal field diameter=7.1 ±0.2 μm) emitting light at 1.31 μm wavelength. Power measurements demonstrate total mesa to rib waveguide coupling losses (excess loss) of ~1.5 –2.0 dB and fiber to mesa coupling losses of ~0.5 to 1.0 dB. The larger than expected total mesa to rib waveguide coupling losses are understood by the unusually large straight waveguide propagation losses of 9.2 ±0.8 dB/cm exhibited by both the straight rib and mesa waveguides on this sample.

An InAlGaAs diode laser with a Tapered rib output was demonstrated at 980 nm wavelength. Such expanded-mode semiconductor lasers are of great interest due to the benefits of reduced far-field divergence and improved coupling efficiency to single-mode optical fiber. The tapered rib laser description (FIG. 9) follows closely that of the previous discussion and comprises a uniform 2 μm-wide AlGaAs/ lnGaAs heterostructure gain section 92 and tapered rib waveguide mode converter 90 tapered down to a 0.7 μm final width. Using a procedure identical to that described above for the 1.3 μm wavelength pin waveguide, overall power-conversion efficiency of the mode expansion is estimated to be 90%. The expanded mode 95 supported by the mesa guide has a simulated coupling efficiency to single-mode fiber of greater than 95%.

The laser is a strained-quantum-well separate-confinement heterostructure type of the composition set forth in Table 1 below which shows the epitaxial structure of the laser for 980 nm operation. Resonant periodic marker layers used for in-situ monitoring of the etches but having virtually no impact on device performance have been omitted for clarity.

TABLE 1

| Material | Thickness (nm) | Doping (cm$^{-3}$) | Description |
| --- | --- | --- | --- |
| GaAs | 100 | p = 8e19 | Cap Layer |
| Al$_{0.1}$Ga$_{0.9}$As | 500 | p = 2e18 | Upper Cladding |
| Al$_{0.1}$Ga$_{0.9}$As | 1500 | p = 5e17 | Upper Cladding |
| grade from | 90 | uid | Graded Interface |
| GaAs | 60 | uid | Active Waveguide |
| In$_{0.2}$Ga$_{0.8}$As | 8 | uid | Quantum Well |
| GaAs | 15 | uid | Barrier |
| In$_{0.2}$Ga$_{0.8}$As | 8 | uid | Quantum Well |
| GaAs | 60 | uid | Active Waveguide |
| grade to Al$_{0.05}$Ga$_{0.95}$As | 100 | uid | Graded Interface |
| Al$_{0.1}$Ga$_{0.9}$As | 2000 | n = 5e17 | Mesa Waveguide |
| Al$_{0.1}$Ga$_{0.9}$As | 5000 | n = 1e18 | Mesa Waveguide |
| Al$_{0.1}$Ga$_{0.9}$As | 1000 | n = 2e18 | Mesa Waveguide |
| Al$_{0.4}$Ga$_{0.6}$As | 1000 | n = 3e18 | Waveguide Barrier |
| GaAs | substrate | n+ | |

A 2 μm-wide rib waveguide is etched in the cladding region above the quantum wells to define the active lasing section in a region of high vertical confinement factor. A tapered rib output coupler section is inserted between the active waveguide and one of the cleaved facets by tapering the rib waveguide width from 2 μm to 0.7 μm over a length of 1.0 mm. A second 10 μm-wide outer mesa provides lateral confinement of the expanded optical mode propagating within the thick lower cladding. The low 10% Al content of the cladding material prevents formation of modes guided by the remaining GaAs material at the top of the mesa and subsequent failure of the mode expansion. Overall length of the lasers is 1.5 mm of which 1 mm is contacted for electrical current injection. The tapered rib section is electrically injected only in the first half of the coupler where significant overlap of the optical mode and InGaAs quantum wells exists.

Lasers were fabricated in MOCVD-grown material using two lithography-and-etch steps. The tapered rib waveguide was defined using electron-beam direct-write lithography. The wide mesa was patterned using optical contact printing. Both were etched using non-selective Cl$_2$ dry etching. After etching, the surface was coated with plasma deposited SiO$_2$, a window opened on top of the rib for p-side ohmic metallization and BeAu ohmic contacts formed. The backside of the wafer was coated with AuGeNiAu ohmic contact metallization prior to rapid-thermal annealing at 360° C. As experimental control devices, uniform 2 μm wide lasers were also fabricated on the same wafer as the tapered rib lasers. Final lasers were tested as-cleaved without facet coatings or heatsink. Injection current was pulsed using 2 μs pulses at a 1 kHz repetition rate. FIG. (10) shows the light output characteristic of a tapered rib laser and a 2-μm wide by 1.25 mm-long control device. Although slope efficiencies are comparable, threshold current of the tapered rib laser is 110 mA compared to 81 mA for the control. In addition, a kink is seen at approximately 150 mA injection current in the tapered rib laser output which is not seen in the control device output. This behavior may be due to non-ideal current injection in the taper section. Only a portion of the taper is contacted for current injection. Current injection into the taper stops at a point approximately midway along the length where the width of the rib becomes too small to open a contact window in the dielectric cap using conventional contact lithography. As a result light confined in the quantum wells below the un-contacted taper region will experience higher absorption. This higher absorption increases the lasing threshold current and reduces efficiency. However, as the current injection increases the quantum well refractive index will decrease in the contacted regions of the rib causing the mode to move into the mesa at relatively larger rib widths. Therefore, at higher injection levels the overall absorption loss of the taper will decrease resulting in an increase in laser efficiency. The kink at ~150 mA injection current is consistent with increased laser efficiency resulting from reduced taper losses. More uniform current injection using optimized layer doping, taper length, processing and electrical contacting are expected to give reduced lasing threshold compared to these demonstration devices.

Coupling efficiency of the tapered rib output to optical fiber was measured using a 1 m length of Spectran SMB-E1310B fiber (this fiber is single mode above 1.25 μm wavelength and has an NA=0.17 at l=1.3 μm.) butt-coupled to the laser facet. The fiber ends were as-cleaved without polishing or lensing of any kind and the bulk of the fiber length was wrapped around a 9 cm diameter spool. Tapered rib laser output including transmission into and through the length of single-mode fiber is shown as the lower curve in FIG. (10). Measured coupling loss from the laser into the fiber is only 0.9 dB.

The far-field optical emission pattern was measured using a 25 mm-long Si CCD array placed 38 mm from the facet. FIG. (11) shows the far-field intensity pattern of two representative tapered rib lasers both perpendicular and parallel to the plane of the epitaxial layers. The far-field patterns are quite stable over a wide range of injection current. The solid line of FIG. (11) is the 1D far-field calculation based on 2D numerical simulations of the tapered rib output. Excellent correlation between the observed and theoretical patterns is observed. The 5.6° and 7.4° full-width-half-maximum (FWHM) far-fields in the perpendicular and parallel axes respectively are significantly smaller and more symmetric than the ~35° and ~9° FWHM values commonly seen in conventional double-heterostructure AlGaAs lasers.

Near-field image measurements of both a tapered rib laser and a 2 $\mu$m-wide control laser are shown in FIGS. (12A and 12B). The tapered rib laser is clearly seen to have a much larger fundamental optical mode as compared to the control device. As seen schematically in FIG. (9) and in the measured profile of FIG. (12b), the output mode is intended to be roughly as tall as it is wide with a characteristic inverted mushroom shape. Back facet emission image of the tapered rib laser is indistinguishable from that of the control laser, FIG. (12a). No evidence of high-order modes is seen at any tested current level.

Unintentionally doped (UID) AlGaAs ridge waveguides for Schottky-barrier Mach-Zehnder interferometers operating at 1.32 $\mu$m wavelength represent a third class of waveguide design for which tapered rib sections have recently been used demonstrated to improve fiber coupling performance. In these devices the waveguide core is often relatively thicker and the core-to-cladding index steps smaller than that used for the pin modulator and diode laser. This results in a slightly larger waveguide with different design and performance details for integrated tapered rib waveguides. However, the principle of operation is the same as that of the pin modulator and laser diode. Table 2 below gives the complete epitaxial layer design form a UID waveguide modulator with a tapered rib waveguide mode converter. AlGaAs graded layers show only AlAs content; the remainder is GaAs.

TABLE 2

| Material | Thickness (nm) | Doping (cm$^{-3}$) | Description |
|---|---|---|---|
| Al$_{0.1}$Ga$_{0.9}$As | 1250 | uid | Upper Cladding |
| GaAs | 1250 | uid | Waveguide |
| Al$_{0.002}$Ga$_{0.8}$As | 50 | uid | Waveguide |
| grade 1.2% to 0.2% AlAs | 250 | uid | Waveguide |
| grade 3.8% to 1.2% AlAs | 600 | n = 1e17 | Waveguide |
| Al$_{0.038}$Ga$_{0.932}$As | 50 | n = 1e17 | Waveguide |
| Al$_{0.03}$Ga$_{0.97}$As | 500 | n = 1e18 | Contact Layer |
| Al$_{0.04}$Ga$_{0.96}$As | 8000 | uid | Mesa Guide |
| Al$_{0.1}$Ga$_{0.9}$As | 1000 | uid | Lower Cladding |
| GaAs | substrate | uid | Substrate |

Figure 13A:
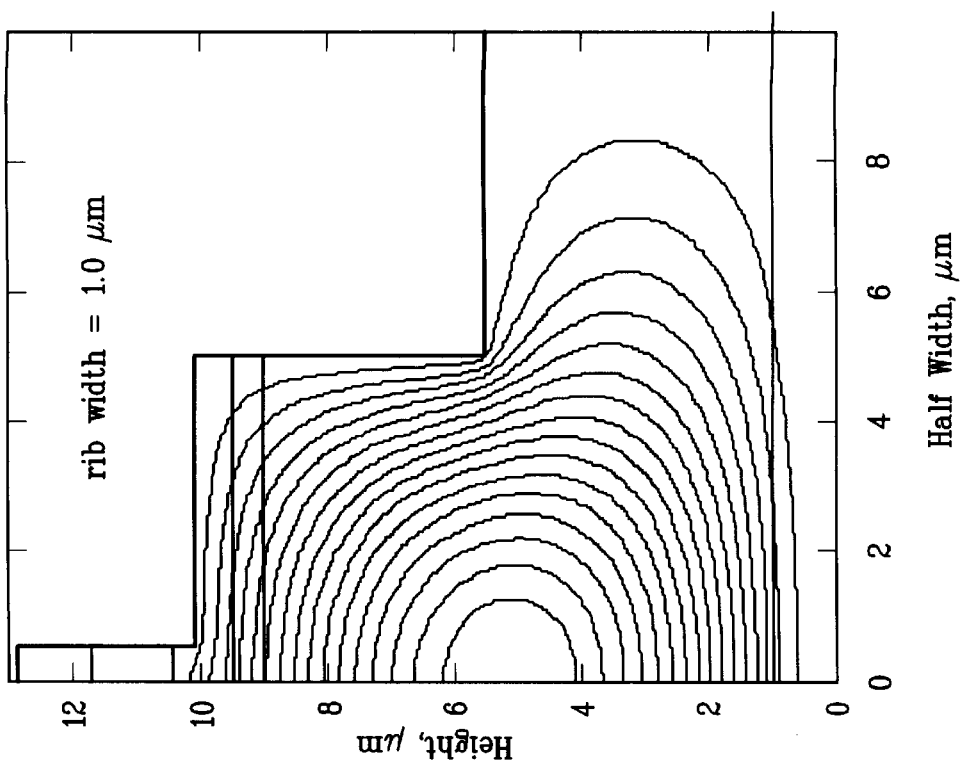
FIGS. 13A and 13B are contour plots of constant fields of eigenmodes at both ends of the UID (Unintentionally Doped) tapered rib waveguide device showing wide rib with small spot size and narrow rib with downwardly shifted large spot size.
Figure 13B:
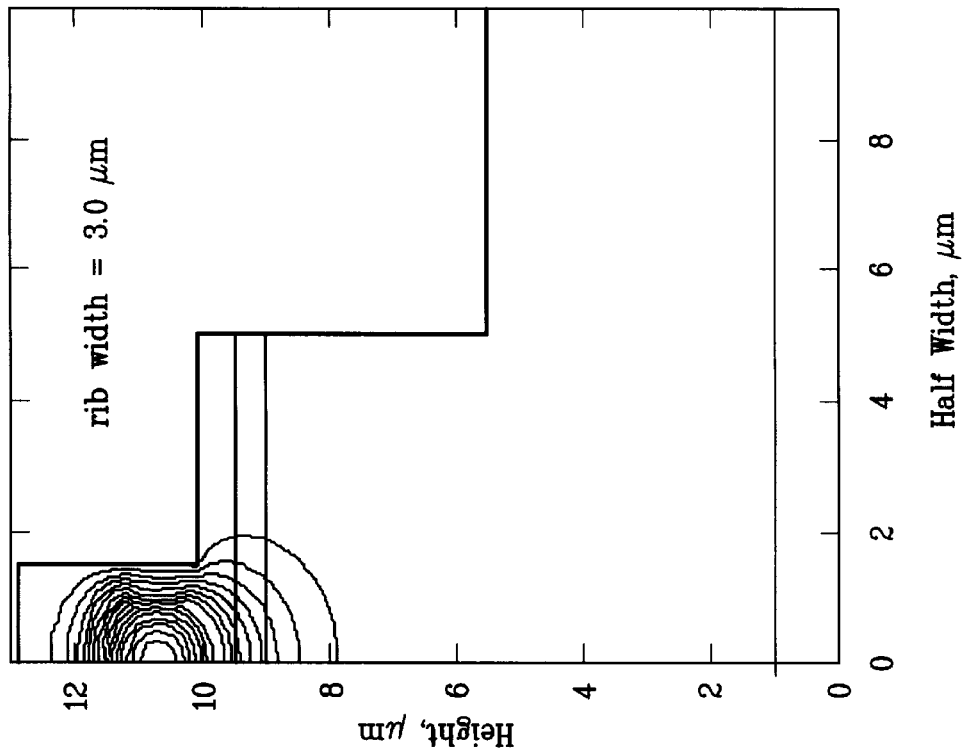
Figure 14:
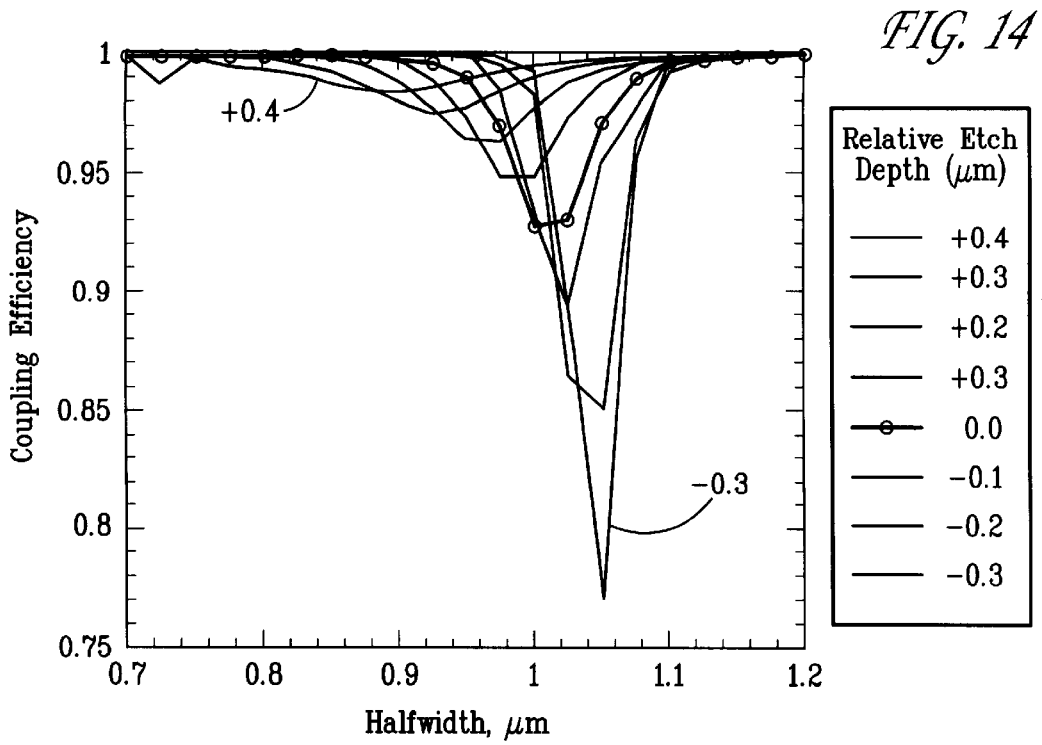
FIG. 14 is a graph showing individual step coupling efficiencies through the UID taper as a function of segment width for a variety of different rib waveguide etch depths, relative to the device of FIGS. 13A and 13B.
Figure 15:
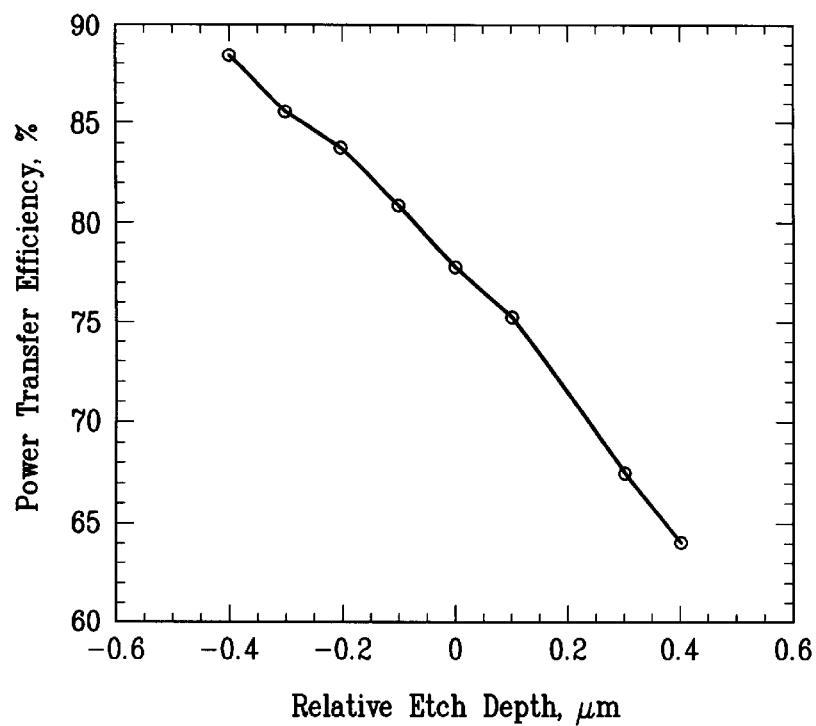
FIG. 15 is a plot of the power transfer efficiency of spot-size transformation as a function of rib waveguide etch depth for the UID rib waveguide device, relative to the device in FIGS. 13A and 13B.

This UID modulator design uses an n$^+$ contact layer between the rib and the mesa for improved electrooptic efficiency. The calculated unexpanded and expanded fundamental modes for the wide and narrow rib are shown in FIGS. (13a) and (13b) respectively. FIG. 14 shows the individual step coupling efficiencies through the taper for various etch depths relative to the rib shown in FIGS. 13A and 13B. Transition of the mode between the small rib and large mesa waveguide occurs at larger rib widths compared to the pin modulator and laser diode. In all cases the narrow dimension of the taper does not need to be any smaller than 1.4 to 1.6 $\mu$m for complete mode expansion to occur. Calculation of the power conversion efficiency for mode expansion is shown in FIG. 15 for tapers starting at 3 $\mu$m and reducing to 1 $\mu$m in width. Power transfer efficiency varies from 64 to 89 percent as the rib etch depth is varied from the bottom to the top of the graded layers. Selection of an ideal etch depth must take into account the conflicting requirements of shallow etching for best spot-size transformation and deep etching for high lateral optical confinement and reduced loss of turning mirrors fabricated with the same etch. An etch depth 0.125 $\mu$m deeper than shown in FIG. 15 and corresponding to a relative depth=+0.125 $\mu$m in FIGS. 16 and 17 was chosen for its combined high 73 percent transfer efficiency and good lateral confinement. Calculated power coupling efficiency of the expanded-mode waveguide output into an 8-$\mu$m spot size (1/e$^2$ intensity diameter) single-mode optical fiber remains between 93.7 and 94.5 percent for all the waveguides plotted in FIG. 15.

The 1 $\mu$m final taper width makes this tapered rib structure particularly well suited for fabrication by optical contact printing. As discussed above, the step size between straight segments of the taper is very important in determining the overall power conversion efficiency. Our model predicts that 0.1 $\mu$m steps will yield a significantly lower power transfer efficiency compared to the 0.025 $\mu$m steps used in the calculation for FIGS. 14 and 15. For patterning of the UID modulator tapered rib waveguide, a contact-print mask plate was fabricated in our laboratory using electron-beam direct write lithography with 0.025 $\mu$m pixel spacing (step size). This contact-print lithography mask was used in a conventional contact print exposure system for photolithographic pattern definition of the desired tapered rib waveguide taper shape. As before, RIBE was used to etch the rib and mesa waveguides to the desired depth.

Figure 16A:
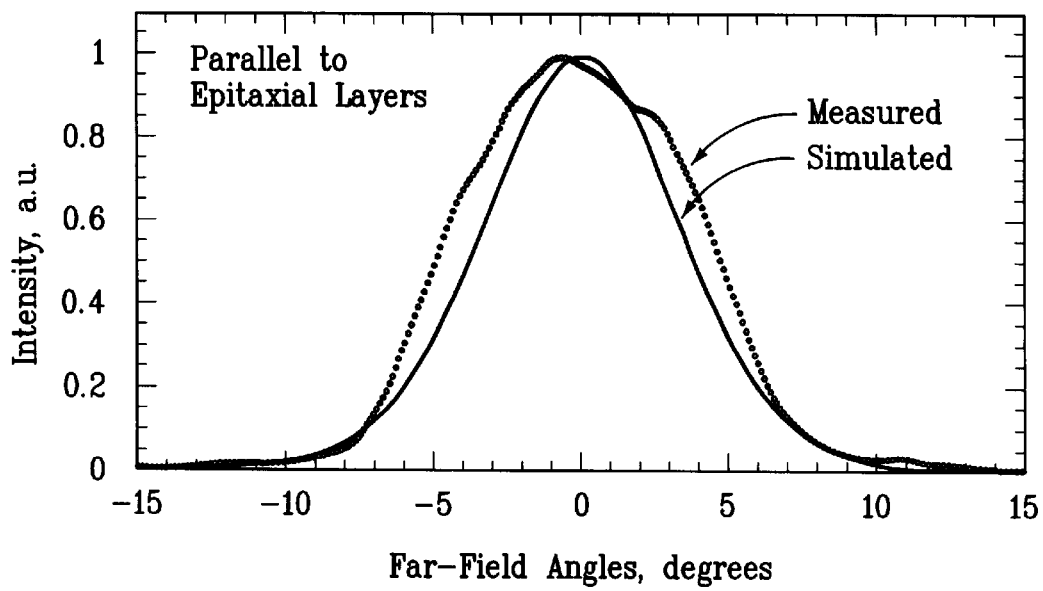
FIGS. 16A and 16B are far-field emission patterns of UID tapered rib waveguide output along axes parallel and perpendicular to the epitaxial layers.
Figure 16B:
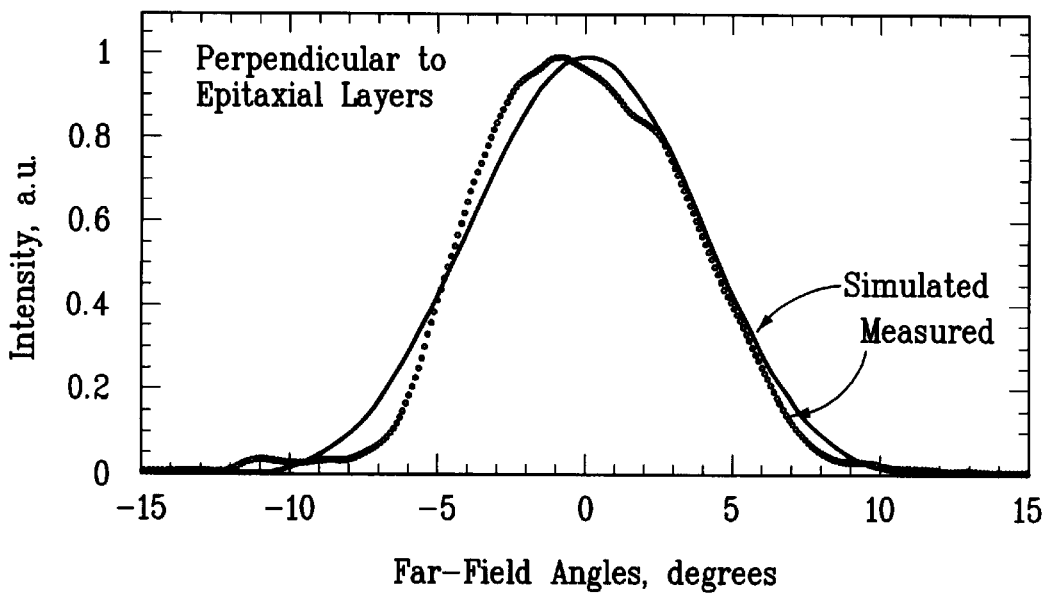

The UID Tapered rib waveguide mode quality and beam expansion were measured at 1.32 $\mu$m wavelength. Very good mode expansion and filling of the mesa waveguide is observed when the rib width is reduced to 1.0 $\mu$m. Far field measurements of the expanded mode using a 10 mm-wide 2D optical beam profiler placed 11.5 mm away from the exit facet confirm the correct behavior of the tapered rib waveguide mode expansion. FIGS. 16(a) and 16(b) show the measured and calculated far-field profiles of on an 8 $\mu$m-wide mesa waveguide with a 1.0 $\mu$m-wide rib along axes parallel and perpendicular to the epitaxial layers. The calculated far-field patterns were obtained using the same method as for the tapered rib laser described above. General good agreement between the measured and calculated far-field patterns is seen although the measured pattern parallel to the layers does show some broadening compared to the calculation. The 8.9° and 9.7° full-width-half-maximum (FWHM) far-fields in the perpendicular and parallel axes respectively are close to the respective calculated values of 9.1° and 7.7°. Calculations of the far-field radiation pattern of the unexpanded mode predict 20° and 29° FWHM along the perpendicular and parallel axes respectively. The combined small far-field radiation pattern and large near-field modal spot size where both are in good agreement with theoretical prediction confirm that the UID tapered rib waveguide is operating as expected.

In order to get an accurate measure of excess loss within the tapered rib waveguide, several tapers were fabricated end-to-end so that the optical mode was repeatedly compressed and expanded. These multiple taper waveguides were compared to straight rib and mesa waveguides fabricated on the same wafer. Losses were measured at 1.32 $\mu$m wavelength using the Fabry-Perot interference method, tuning the cavity length by adjusting the temperature of the waveguide. Straight rib waveguide loss was 1.02±0.17 dB/cm while mesa waveguide losses were 0.77±0.13 dB/cm. Using these straight waveguide losses, the deduced tapered rib waveguide excess loss was 1.84±0.50 dB. This loss corresponds to between 58.3 and 73.4 percent power transfer efficiency through the mode expander. The upper limit of 73.4 percent measured power transfer efficiency is consistent with the calculated 73% efficiency including only the effect of radiation at the steps in the rib width.

The above descriptions of the three examples present the best modes of the invention presently known to the inventors. However, those with skill in the art will appreciate that other variations on the basic tapered rib waveguide device are possible. The true scope of the present invention is to be found in the appended claims.

What is claimed is:

1. An adiabatic tapered rib coupler to an optical fiber for use with a cutoff mesa waveguide semiconductor optical device, wherein the cutoff mesa waveguide optical device comprises a first isolated rib structure having opposing side walls of height h and a width w1, the first isolated rib being centrally located above a mesa structure located above a substrate which mesa structure has an output face at one end with the first isolated rib structure being terminated short of the output face of the mesa structure, such that only the fundamental optical mode is allowed to propagate within the device and wherein the fundamental mode has its region of maximum intensity bound to the first isolated rib structure, the tapered rib coupler comprising:

a tapered rib structure located above the mesa and aligned with the first rib structure and having side walls of height h, the tapered rib structure having a tapered portion with a first end of width w1 monolithically connected to the termination of the first rib structure and a second end of width w2, where w2<w1, wherein the decrease in width between w1 and w2 is sufficient to force at least 80% of the light in the fundamental mode that was bound to the first isolated rib structure down into the mesa while remaining aligned with the tapered rib structure; and the mesa structure having a height and width so as to match the effective aperture of the optical fiber and a composition such that only a single local maximum refractive index region proximate to the upper surface of the mesa is present but with the center of the fundamental mode on the output face of the mesa being located below the maximum refractive region.

2. The tapered rib coupler of claim 1 wherein the structures comprise compounds of elements selected from groups III and V of the periodic table.

3. The tapered rib coupler of claim 1 wherein the tapered rib structure is at least about 500 $\mu$m in length.

4. The tapered rib coupler of claim 1 wherein the each of the side walls of the tapered rib structure comprise a series of short parallel segments whose width apart decreases by a predetermined amount, the transition between segments in each side wall forming an offset face between adjacent segments, the predetermined amount being less than that which would cause a significant scattering loss of light from the offset faces.

5. The tapered rib coupler of claim 4 wherein the predetermined amount is about 0.025 $\mu$m and the scattering loss is less than about 1 dB.

6. The tapered rib coupler of claim 1 wherein the side walls of the tapered rib smoothly taper between w2 and w1.

7. The tapered rib coupler of claim 1 wherein the tapering is linear.

8. The tapered rib coupler of claim 1 wherein the tapering is non-linear.

9. The tapered rib coupler of claim 1 wherein the second end of the tapered rib structure is even with the output face of the mesa structure.

10. The tapered rib coupler of claim 1 wherein the second end of the tapered rib structure does not reach the output face of the mesa structure.

11. The tapered rib coupler of claim 1 wherein the dimensions of the structures are such that the angular divergence of the fundamental mode as it leaves the output face of the mesa structure is less than 10° in the vertical and horizontal directions.

12. The tapered rib coupler of claim 1 wherein the semiconductor optical device is an optical modulator.

13. The tapered rib coupler of claim 1 wherein the semiconductor optical device is a laser.

14. The tapered rib coupler of claim 13 wherein the semiconductor laser includes an upper cladding layer forming the first isolated rib structure, a multiquantum well active region at or near the top of the mesa structure forming the local maximum refractive index region, and a lower cladding layer below the multiquantum well active layer forming at least the remainder of the mesa structure.

15. The tapered rib coupler of claim 1 wherein the optical fiber is a single mode fiber.

16. The coupler of claim 15 wherein the fiber is optimized to transmit light at 1.3 $\mu$m wavelength.

17. The coupler of claim 15 wherein the fiber is optimized to transmit light at 980 nm wavelength.

18. The coupler of claim 15 wherein the fiber is optimized to transmit light at 1.5 $\mu$m wavelength.

19. The tapered rib coupler of claim 1 wherein the intersection of the side walls of the tapered rib structure and the top surface of the mesa structure includes a fillet transition.

* * * * *